United States Patent
Diederichs et al.

(10) Patent No.: US 8,384,504 B2
(45) Date of Patent: *Feb. 26, 2013

(54) SUPERCONDUCTING QUICK SWITCH

(75) Inventors: Jost Diederichs, Poway, CA (US);
Andreas Amann, San Diego, CA (US);
Michael B. Simmonds, Bozeman, MT (US)

(73) Assignee: Quantum Design International, Inc., San Diego, CA (US)

( * ) Notice: Subject to any disclaimer, the term of this patent is extended or adjusted under 35 U.S.C. 154(b) by 1763 days.

This patent is subject to a terminal disclaimer.

(21) Appl. No.: 11/326,903

(22) Filed: Jan. 6, 2006

(65) Prior Publication Data

US 2007/0159280 A1   Jul. 12, 2007

(51) Int. Cl.
*H01F 1/00* (2006.01)
*H01F 7/00* (2006.01)
*H01F 6/00* (2006.01)

(52) U.S. Cl. .......................... 335/216; 361/19

(58) Field of Classification Search .................. 335/216, 335/226, 241, 268, 300; 361/19, 164; 324/248
See application file for complete search history.

(56) References Cited

U.S. PATENT DOCUMENTS

| | | | | |
|---|---|---|---|---|
| 3,800,256 A * | 3/1974 | Garwin | ........................ | 335/216 |
| 4,021,633 A * | 5/1977 | Kuwabara et al. | ........... | 200/262 |
| 4,559,576 A * | 12/1985 | Ries | ................................ | 361/19 |
| 4,623,769 A | 11/1986 | Franksen | | |
| 4,689,707 A * | 8/1987 | Schwall | ......................... | 361/19 |
| 4,763,221 A * | 8/1988 | Takechi | ........................ | 361/141 |
| 4,764,837 A * | 8/1988 | Jones | ............................... | 361/19 |
| 4,807,084 A * | 2/1989 | Takechi | ........................ | 361/141 |
| 4,851,958 A * | 7/1989 | Takechi | ........................ | 361/141 |
| 4,906,861 A | 3/1990 | Roy et al. | | |
| 4,994,935 A * | 2/1991 | Takechi | ........................ | 361/141 |
| 5,216,568 A * | 6/1993 | Harada et al. | ................... | 361/19 |
| 5,361,055 A | 11/1994 | Peck | | |
| 5,394,130 A | 2/1995 | Xu et al. | | |
| 5,432,669 A * | 7/1995 | Nemoto et al. | ............... | 361/143 |
| 5,532,638 A * | 7/1996 | Kubo et al. | ................... | 327/368 |
| 5,650,903 A * | 7/1997 | Gross et al. | .................... | 361/19 |
| 5,680,085 A * | 10/1997 | Aihara et al. | ................. | 335/216 |
| 5,686,877 A * | 11/1997 | Keller et al. | ................... | 335/216 |
| 5,731,939 A * | 3/1998 | Gross et al. | .................... | 361/19 |
| 5,739,997 A * | 4/1998 | Gross | .............................. | 361/19 |
| 5,847,633 A * | 12/1998 | Keller et al. | ................... | 335/216 |
| 6,317,303 B1 | 11/2001 | Zeigler et al. | | |
| 6,563,316 B2 * | 5/2003 | Schauwecker et al. | ....... | 324/318 |
| 6,646,836 B2 | 11/2003 | Yoshikawa | | |
| 6,700,469 B2 * | 3/2004 | Amann et al. | ................. | 335/301 |
| 6,717,781 B2 * | 4/2004 | Xu et al. | .......................... | 361/19 |
| 6,777,938 B2 * | 8/2004 | Schlenga et al. | .............. | 324/322 |
| 6,781,494 B2 * | 8/2004 | Schauwecker et al. | ....... | 335/299 |

(Continued)

OTHER PUBLICATIONS

Uchiyama et al., Low-power persistent switch for superconducting magnet, Rev. Sci. Instrum. 58 (11), Nov. 1987, 2 pages.

*Primary Examiner* — Mohamad Musleh
(74) *Attorney, Agent, or Firm* — The Maxham Firm

(57) ABSTRACT

A magnet system for generating a magnetic field may include a superconducting magnet, a switch, and a heater element thermally coupled to the switch. The superconducting magnet is structured to generate magnetic fields, and the switch includes a non-inductive superconducting current carrying path connected in parallel to the superconducting magnet. In general, the switch is structured to only carry a level of current that is a portion of the current required to obtain a full field by the superconducting magnet.

39 Claims, 4 Drawing Sheets

U.S. PATENT DOCUMENTS

| | | | |
|---|---|---|---|
| 6,977,571 B1* | 12/2005 | Hollis et al. | 335/216 |
| 7,224,250 B2* | 5/2007 | Nemoto et al. | 335/216 |
| 2002/0171520 A1* | 11/2002 | Yoshikawa | 335/216 |
| 2003/0057942 A1 | 3/2003 | Biltcliffe et al. | |
| 2005/0145617 A1* | 7/2005 | McMillin et al. | 219/543 |
| 2006/0176132 A1* | 8/2006 | Atkins et al. | 335/216 |
| 2006/0197637 A1* | 9/2006 | Mallett | 335/216 |
| 2006/0279387 A1* | 12/2006 | Nemoto et al. | 335/216 |
| 2006/0291112 A1* | 12/2006 | Markiewicz | 361/19 |

\* cited by examiner

SUPERCONDUCTING QUICK SWITCH

BACKGROUND OF THE INVENTION

1. Field of the Invention

The present invention relates generally to magnet systems, and in particular to a non-persistent switch for use with a superconducting magnet.

2. Discussion of the Related Art

As is well known, a magnet can be made superconducting by placing it in an extremely cold environment, such as by enclosing it in a cryostat or pressure vessel containing liquid helium or other cryogen. The extreme cold reduces the resistance in the magnet coils to negligible levels. After the power source that is initially connected to the coil is removed, the current will continue to flow through the magnet coils relatively unimpeded by the negligible resistance, thereby maintaining a magnetic field.

To maintain current flow in the magnet coils after removal of power, it is typically necessary to complete the electric circuit within the cryogenic environment with a superconducting switch that is connected in parallel with the power supply and the magnet coils. The superconducting switch generally consists of a superconducting conductor, which when driven into the non-superconducting or normal state, has sufficient resistance so that current from the power supply will essentially flow through the magnet coils during "ramp-up." When the desired magnetic field current is achieved, the switch is returned to its superconducting state and the magnet current commutates out of the power supply and through the switch when the power supply is ramped down. The magnet is now in what is referred to as "persistent mode."

There are four characteristics that a superconducting switch typically exhibits. One, it must be capable of easily and quickly being transformed (switched) from the superconducting state to the normal state, and vice versa. Three ways this can be done are: a) thermally—by heating the superconducting material above its transition temperature; b) magnetically—by applying a magnetic field greater than the critical field of the material; or c) electrically—by raising the current in the material above its critical current. The thermal method is the most common. Two, it must have a high enough resistance in its normal state such that current flow through the switch during ramp-up is negligible so that excessive heating in the cryogen environment is not produced. Three, the switch must be stable. That is, other than during a desired transition phase, it must not transition from the superconducting to normal state. Four, it must be capable of carrying the same high currents as the magnet coils.

Conventional persistent switches of the thermal type operate by heating the superconducting material to a temperature above its superconducting critical temperature. One known thermal persistent switch includes a resistive wire wound about the superconducting wire. Normalization of the superconducting material of the switch is effected by applying electrical current to the resistive wire, thereby heating the superconducting material to above its critical temperature. One of the challenges in designing a superconducting switch is to balance the conflicting requirements of minimizing transition time between a superconducting state and a resistive state, and the need for low heat output to minimize cryogen boil-off.

SUMMARY OF THE INVENTION

In accordance with an embodiment, a magnet system for generating a magnetic field includes a superconducting magnet, a switch, and a heater element thermally coupled to the switch. The superconducting magnet is structured to generate magnetic fields, and the switch includes a non-inductive superconducting current carrying path connected in parallel to the superconducting magnet. In general, the switch is structured to only carry a level of current that is a portion of the current required to obtain a full field by the superconducting magnet.

BRIEF DESCRIPTION OF THE DRAWING

The above and other aspects, features, and advantages of the present invention will become more apparent upon consideration of the following description of preferred embodiments, taken in conjunction with the accompanying drawing figures, wherein.

DETAILED DESCRIPTION OF PREFERRED EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. As a matter of convenience, various components of a magnet system and associated superconducting switch will be described using exemplary materials, sizes, shapes, and dimensions. However, the present invention is not limited to the stated examples and other configurations are possible and within the teachings of the present disclosure.

Figure 1:
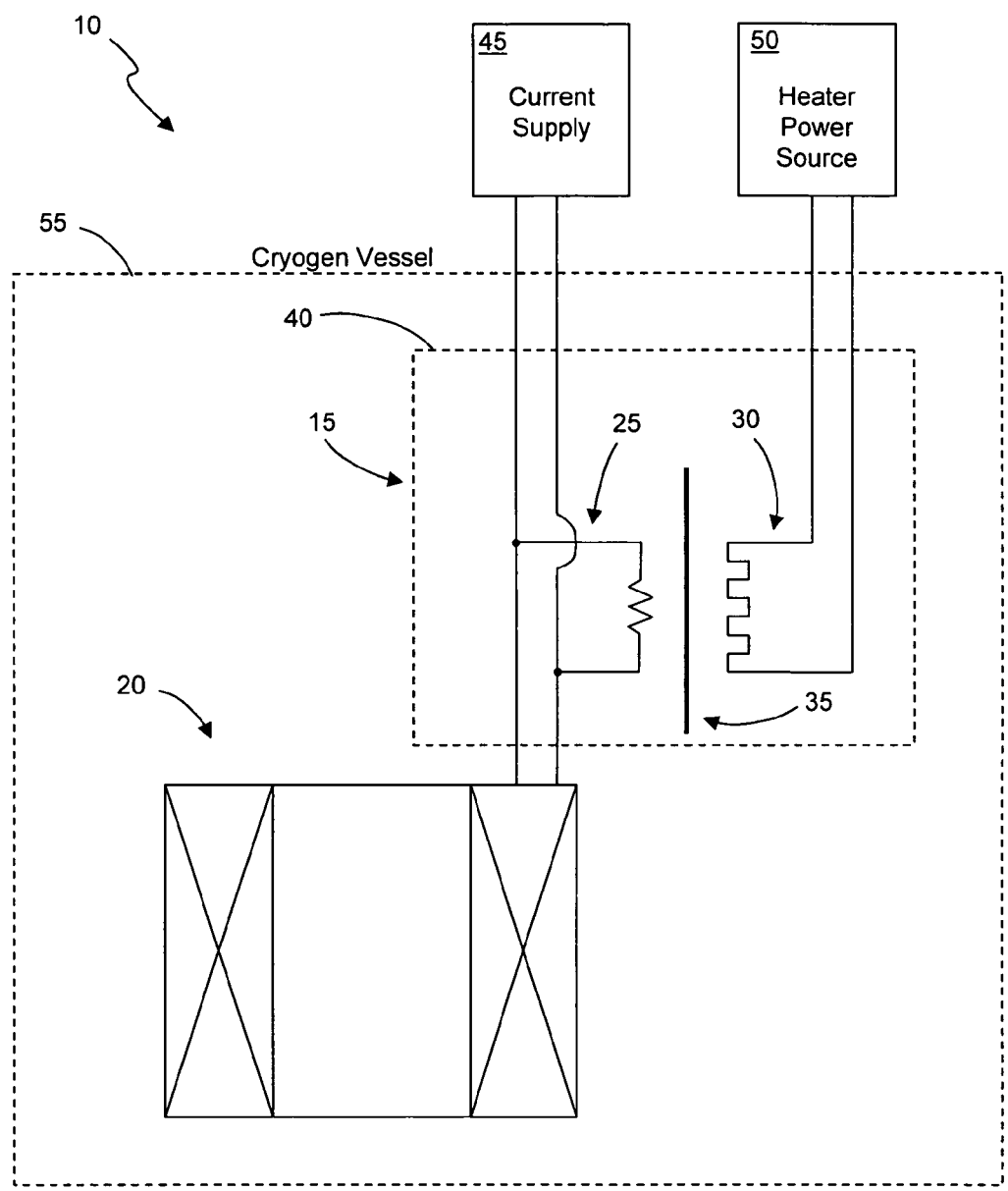
FIG. 1 is an electrical schematic diagram of a magnet system in accordance with an embodiment of the present invention.

Referring now to FIG. 1, an electrical schematic diagram of an embodiment of a magnet system of the present invention is shown. In particular, magnet system 10 is shown having switch assembly 15 and superconducting magnet 20. The switch assembly includes switch 25, which is in electrical communication with the magnet, and thermally coupled to heater element 30. Optional radio frequency (RF) shield 35 is shown positioned relative to the switch and heater elements, and effectively reduces the RF coupling between these elements. The various components of the switch assembly are shown contained within housing 40.

Current supply 45 may be used to supply electrical current to magnet 20, and heater power source 50 provides electrical current to heater element 30. In an embodiment, the magnet and various components of the switch assembly may be located in a suitably cooled environment, such as vessel 55, which enables the superconducting properties of the magnet and switch to be exploited.

Vessel 55 may be implemented using any suitable container or structure designed to contain liquid helium or other cryogen. Housing 40 may be formed from materials that are not electrically conductive, and is typically used to contain the various components of switch assembly 15. In embodiments in which the housing and included components are subjected to a cryogenic environment, such as that illustrated in FIG. 1, the housing may additionally include thermal materials. Such thermal materials are structured to inhibit heat transfer, from switch 25 and heater element 30, to the surrounding cryogen contained with the vessel. Reducing heat transfer to the cryogen reduces costly boil-off during the magnet charging and discharging processes (discussed in detail below).

In an embodiment, magnet 20 and switch 25 may include coils wound from a suitable superconducting wire formed from, for example, NbTi, $Nb_3Sn$, and the like. The magnet is generally capable of providing a range of magnetic fields, as controlled by current supplied by current supply 45, and operating in conjunction with the switch.

Switch 25 includes a non-inductive current carrying path connected in parallel to the magnet. Optimally, the switch is structured to only carry a level of current that is a portion (that is, less than 100%) of the current required by magnet 20 to obtain a full field. By way of non-limiting example, the switch may be structured so that it is capable of only carrying a level of current that is about 1%-20%, or more preferably about 2%-7%, of the current required by magnet 20 to obtain a full field.

In general, the superconducting wire used to form magnet 20 may have a diameter that ranges from about 25 μm-125 μm, to about six inches, or more. The magnet may be implemented using conventional magnet technologies, the specifics of which are not essential to the present invention. Switch 25 may be formed from superconducting wire (for example, non-clad, bifilar wound wire) having a diameter that provides the above-described current carrying levels. There is generally no minimum wire diameter required for switch 25. In a typical embodiment, the superconducting wire used for switch 25 has a diameter of about 5μm-125μm, but greater diameters are possible.

With further reference to FIG. 1, operation of a magnet system in accordance with an embodiment of the present invention will now be described. Initially, the cryogen contained within vessel 55 cools magnet 20 and switch 25 so that they are in a superconducting state. At this point, the magnet system may generate a magnetic field in accordance with the level of current supplied by current source 45.

At some point, a change in the magnetic field generated by the magnet system is desired. This change in magnetic field may be accomplished by heater power source 50 supplying current to heater element 30, thereby heating switch 25 to above its superconducting critical temperature. Once the critical temperature has been reached, the switch transitions from a superconducting state (closed state) to a non-superconducting resistive state (open state). When the switch reaches the resistive state, current supply 45 may modify or otherwise change the amount of current supplied to magnet 20.

When the supplied electrical current reaches a particular or desired current value, as determined by the desired field to be produced by the magnet, power from the heater power source is turned off. This allows heater element 30, and consequently switch 25, to cool. As the switch cools, it falls below the superconducting critical temperature and transitions back to the superconducting state (closed state).

In contrast to systems that utilize persistent switches, the current supplied by current supply 45 is not removed from magnet 20 after the switch transitions back to the superconducting state. Instead, current supply 45 maintains current to the magnet, thereby producing a stable field. Power to the magnet must generally be maintained since switch 25 is not designed to sustain the magnet in the persistent mode. This is because the switch cannot carry the full field current level of the magnet. Without maintaining the current supply to the magnet, the generated magnetic fields would decay, and the magnet would eventually demagnetize. Note that it is possible that continually applying current to the magnet may affect the resultant field because of current-induced noise. However, switch 25 shorts out any noise that would otherwise be introduced into the magnet.

The field produced by magnet 20 may again be changed by essentially repeating the above-described operations. For instance, heater power source 50 may again supply current to heater element 30, causing switch 25 to be heated to above its superconducting critical temperature. While the switch is in the resistive state, the current supplied to magnet 20 by current supply 45 is changed according to the desired field to be generated. When the supplied electrical current reaches the desired value, the heater power source is turned off, and the temperature of the switch falls below the superconducting critical temperature. Switch 25 ultimately transitions back to the superconducting state (closed state). Again, current supply 45 continues to provide current to the magnet.

Benefits that may be realized by the various switches disclosed herein include relatively faster charge times and decreased cryogen boil-off. Overall magnet charge time may be improved by reducing the amount of time required for transitioning the switch between superconducting and resistive states. Switch 25 experiences transition times that are significantly lower than those possible by a conventional persistent switch, for example. Switch 25 experiences transition times (from either the cooled or the heated state) on the order of 0.5-1.5 seconds. These transition times are possible because of the relatively small size of the wire that forms the switch.

Another reason for faster charge time is because switch 25 may be implemented with a higher resistance than typically present in a conventional persistent switch. For example, in an embodiment, switch 25 may have a resistance between about 60 ohms-500 ohms, or higher. This higher switch resistance allows for higher charge voltage to be applied to the magnet during a charge phase. Higher charge voltage translates to a decrease in charge time to achieve a desired current level in the magnet.

Minimizing cryogen boil-off in a magnet system is also desirable since it is a costly and time-consuming process to maintain cryogen in the containment vessel. Boil-off occurs as a result of the heat generated by the switch heating device, such as heating element 30. Boil-off also occurs during the magnet charging phase since switch 25 is in a resistive (non-superconducting) state during this phase. When the switch is in the resistive state, there is a voltage across the switch. This voltage generates heat, which consequently results in the undesirable cryogen boil-off.

The amount of boil-off generated by switch 25 may be reduced, as compared to conventional persistent switches, for several reasons. First, switch 25 is typically much smaller than conventional persistent switches, thereby requiring less heat for the switch to reach the superconducting critical temperature. Less heat translates to decrease boil-off. Furthermore, the decreased charge time minimizes the length of time that the switch remains in the resistive state. This reduces the length of time that there is a voltage across the switch, which reduces the amount of generated heat and corresponding boil-off.

Another benefit provided by switch 25 is that the connection requirements between the switch and magnet 20 are not as strict, as compared the requirements of conventional persistent switches. In general, conventional persistent switches require care in being connected to a magnet since excessive amounts of resistance resulting from this connection would be undesirable. However, the present invention does not have any such requirements and higher resistance caused by the switch-to-magnet connection can be factored into the overall resistance of the switch.

In accordance with an embodiment, an additional advantage relates to the relatively higher resistance of switch 25. For instance, when charging a typical magnet, any current flowing in the switch may represent a reduction in the true field. Such measurements may be inferred by monitoring the current in the leads. However, it is somewhat difficult to ascertain the effective resistance of a warm persistent switch, so this effect cannot be compensated for very accurately. Switch 25 minimizes this problem in proportion to its higher resistance.

To illustrate the various benefits provided by an embodiment of the switch and magnet system of the present invention, the following is presented. A magnet system operating with a conventional persistent switch is compared with the same system operating with switch 25. For both types of switches, magnet 20 is ramped from 0 tesla-9 tesla, stopping every 0.01 tesla. A magnet system utilizing the conventional persistent switch was operated in known fashion. The resistance of the conventional persistent switch is 30 ohms, and the power provided by the heater power source is 75 mW (35 mA across 60 ohms). For both setups, magnet 20 had a charging voltage of 5 V, an inductivity of 10 henries (H), and a current at 9 tesla of 50 A.

Operation of the magnet system utilizing switch 25 is as follows. Each time the ramping process is stopped, switch 25 is heated so that it transitions from a superconducting state (closed state) to a resistive state (open state). Current supply 45 then supplies additional current to magnet 20 until the current in the magnet reaches the desired value. Then the current supplied to heater element 30 is shut off, and the switch is allowed to cool, transitioning back to the superconducting state (closed state). Once again, current supply 45 maintains current to the magnet, even after the switch has reached the superconducting state. Stopping the ramping process permits measurements to be taken at the generated field. In this scenario, 900 separate measurements were taken. By way of non-limiting example, the resistance of switch 25 is 250 ohms, and the power provided by heater power source 50 is 20 mW (30 mA across 20 ohms).

Table 1 below provides an example of measuring time for both a conventional persistent switch and switch 25. More specifically, Table 1 depicts the time necessary for ramping the magnet to the desired magnet field, the time for opening and closing the switch (that is, the time it takes for the switch to transition from a superconducting state (closed state), to a resistive state (open state), and back to a superconducting state (closed state)), and the total time necessary for obtaining 900 separate measurements. Note that the illustrated times are approximate.

TABLE 1

| Event | Conventional Persistent Switch | Switch 25 |
|---|---|---|
| Ramping time (t = L ΔI/V) | 100 Seconds | 100 Seconds |
| Time for closing and opening the switch, per measuring point | 60 Seconds | 1.0 Seconds |
| Total time for 900 measurements | 54,000 Seconds | 900 Seconds |

The foregoing results illustrate that the above-described switch, according to embodiments of the invention, allows for significantly faster measurement times. As noted in this table, a typical persistent switch may take about 60 seconds for opening and closing. This results in a total time of about 900 minutes for obtaining 900 measurements. In such a scenario, switch 25 performs over 50 times faster than a conventional persistent switch.

As noted above, the various embodiments of the switch and magnet systems of the present invention also produce reduced amounts of cryogen boil-off, as compared to conventional persistent switches. Table 2 below provides an example of various parameters relating to the boil-off of liquid Helium for both types of switches. The same switch setup, as described above in conjunction with Table 1, was used for the data for Table 2.

TABLE 2

| Event | Conventional Persistent Switch | Switch 25 |
|---|---|---|
| Power across switch while ramping (P = U²/R) | 833 mW | 100 mW |
| Power across switch heater | 75 mW | 20 mW |
| Ramping time (t = L ΔI/V) | 100 seconds | 100 seconds |
| Time for opening the switch per point (pre-heat time) | 30 seconds | 0.5 seconds |
| Total energy per measurement | 2115.83 J (100 s · 908 mW + 900 · 30 s · 75 mW) | 21.00 J (100 s · 120 mW + 900 · 0.5 s · 20mW) |
| Total liquid He consumption per measurement | 825 ml | 8.2 ml |

These results illustrate the significant savings that may be realized in terms of the amount of energy required to operate switch 25. This energy savings translates to a reduction of liquid Helium boil-off.

Figure 2:
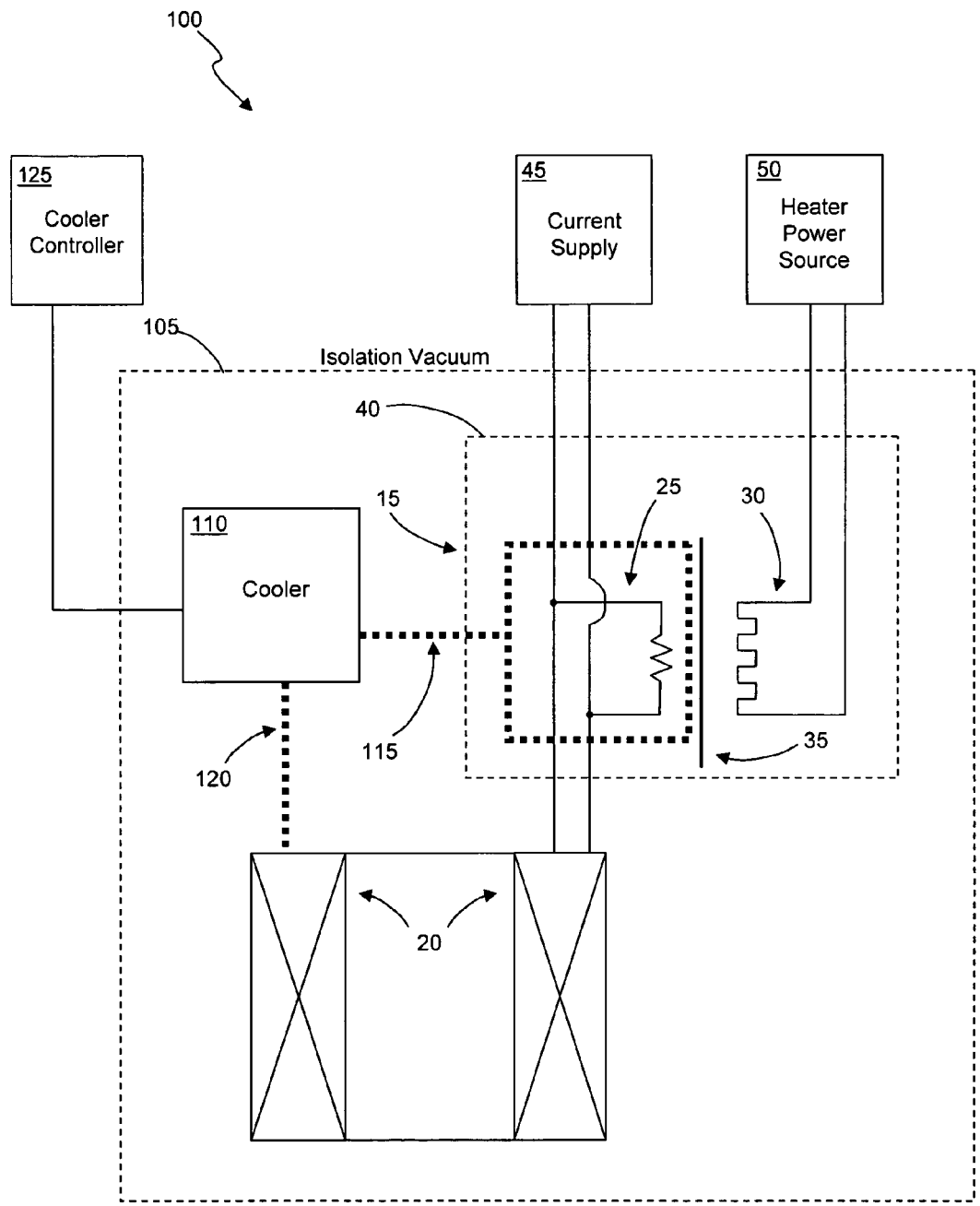
FIG. 2 is an electrical schematic diagram of a magnet system in accordance with an alternative embodiment of the present invention.

FIG. 2 is an electrical schematic diagram of an alternative embodiment of a magnet system. In this figure, magnet system 100 includes switch assembly 15 and superconducting magnet 20 positioned within isolation vacuum 105. Cooler 110 may be used to cool switch 25 and magnet 20 to a desired superconducting temperature. In particular, the cooler is shown having thermal link 115, which is in thermal contact with the switch, and thermal link 120, which is in thermal contact with the magnet. Cooler 110 may be implemented using known cooling systems, such as a compressed gas cooler, which can provide the necessary cooling to the magnet and switch to make these elements superconducting. Isolation vacuum 105 is a structure typically used to thermally isolate the various components contained within the isolation vacuum from the outside environment.

Operation of magnet system 100 may occur as follows. Initially, cooler 110 cools magnet 20 and switch 25 so that they are in a superconducting state. At this point, the magnet system may generate a magnetic field in accordance with the level of current supplied by current source 45. As before, the power supplied by the current supply is not removed from magnet 20 while the magnet generates the magnetic field.

At some point, a change in the magnetic field generated by the magnet system is desired. This change in magnetic field may be accomplished in a manner similar to that described in conjunction with FIG. 1. That is, switch 25 may be heated to above its superconducting critical temperature. When the switch reaches the resistive state, current supply 45 may modify or otherwise change the amount of current supplied to magnet 20. When the supplied electrical current reaches a particular or desired current value, as determined by the desired field to be produced by the magnet, the switch is allowed to cool and fall below the superconducting critical temperature and transition back to the superconducting state (closed state). As before, the power supplied by current supply 45 is not removed from magnet 20 after the switch transitions back to the superconducting state. Current supply 45 typically maintains current to the magnet, thereby producing a stable magnetic field. The field produced by magnet 20 may be changed by essentially repeating the above-described operations.

Switch 25 has been described as being formed from superconducting wire. However, this is not a requirement and other techniques and structures that are capable of providing a non-inductive current carrying path may alternatively or additionally be used. For instance, switch 25 may be implemented using a device containing integrated circuitry such that the current carrying path includes a thin-film current carrying path.

The various magnet systems disclosed herein include a single magnet 20 and a single switch assembly 15. However, a magnet system having a plurality of magnets, each having a separate switch assembly, is also possible and within the teachings of the present disclosure.

Various embodiments have been disclosed in which a superconducting magnet has been utilized to generate a desired field. It is to be understood that such a magnet may be implemented with one or more superconducting coils, or with one or more solenoids.

Figure 3:
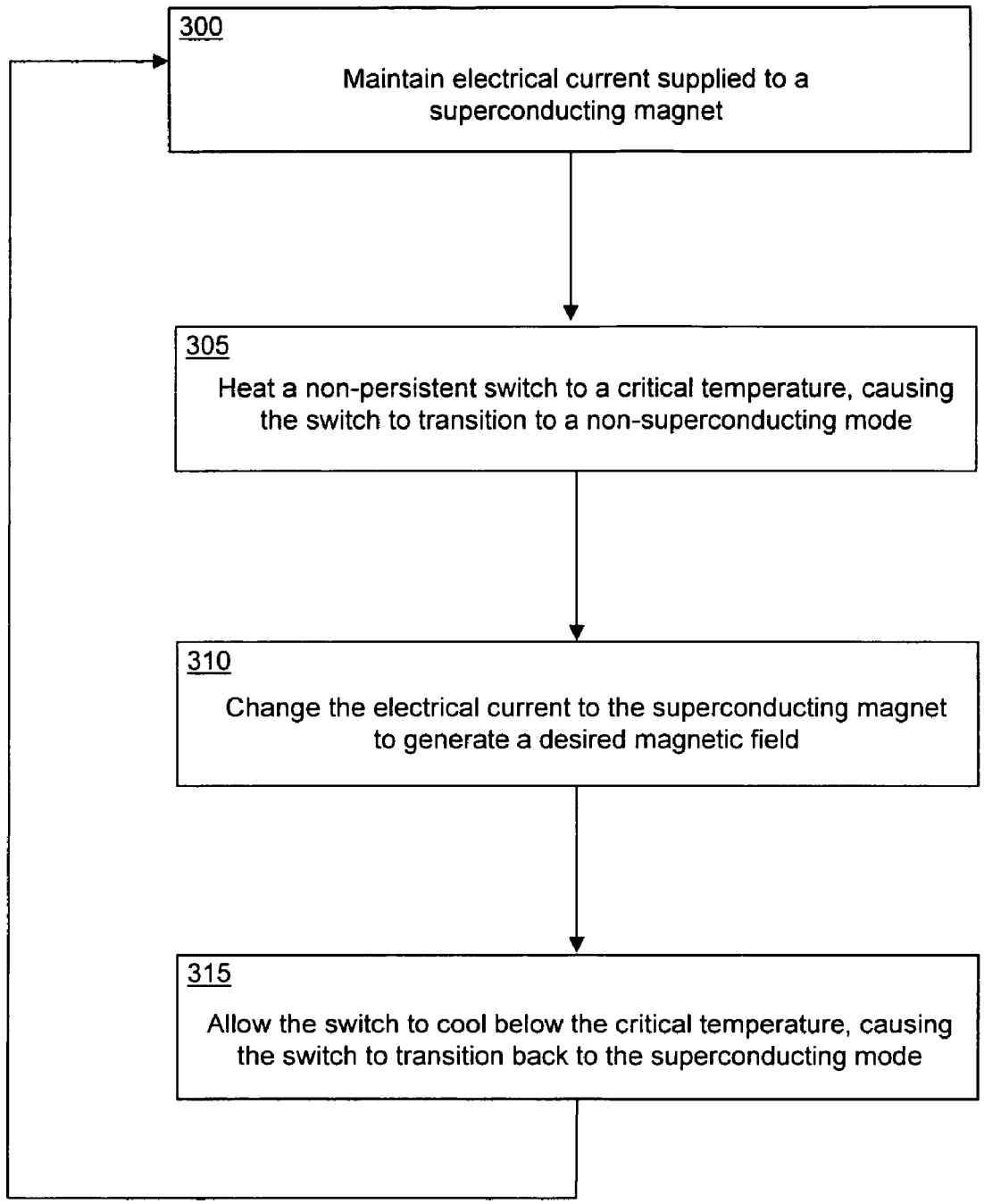
FIG. 3 is a flowchart showing exemplary operations for generating magnetic fields in accordance with an embodiment of the invention.

FIG. 3 is a flowchart showing exemplary operations for generating magnetic fields in accordance with an embodiment of the invention. Block 300 includes maintaining electrical current supplied to a superconducting magnet, which may be structured to generate magnetic fields. If desired, the magnetic fields generated by the superconducting magnet may be changed according the operations of blocks 305, 310, and 315. For instance, at block 305, a non-persistent switch may be heated to a critical temperature. Typically, such a non-persistent switch operates in a superconducting mode and is connected in parallel to the superconducting magnet. Such heating causes the non-persistent switch to transition to a non-superconducting mode. At block 310, electrical current provided to the superconducting magnet may be changed to generate a desired magnetic field. Next, the switch may be allowed to cool below the critical temperature, thus causing the switch to transition back to the superconducting mode (block 315). If desired, operations of blocks 300, 305, 310, and 315 may be repeated with different electrical current values to generate correspondingly different magnetic fields.

Although various processes and methods according to embodiments of the present invention may be implemented using the series of operations shown in FIG. 3, those of ordinary skill in the art will realize that additional or fewer operations may be performed. Moreover, it is to be understood that the order of operations shown in FIG. 3 is merely exemplary and that no single order of operation is required.

It is possible that the switch may be damaged as a result of a critical event such as, for example, a quench or a sudden or unexpected loss of power to the magnet current supply. During a quench, the magnet may generate high internal voltages and locally elevated temperatures. This causes electrical and mechanical stresses in the windings, and may also damage the switch. A quench may occur for a variety of reasons. For example, the magnet system may suffer a loss of cooling power because of insufficient amounts of cryogen in the vessel, or a failure in the active cooler.

Regardless of the cause of the critical event, a potentially large voltage may develop across the magnet and switch since these elements are connected in parallel. Since the switch is typically implemented so that it only carries a fraction of the magnet current while superconducting, and has a high resistance in its normal state, a relatively large voltage across the switch may result in a large amount of power being dissipated in the switch. This could cause significant damage to the switch.

Figure 4:
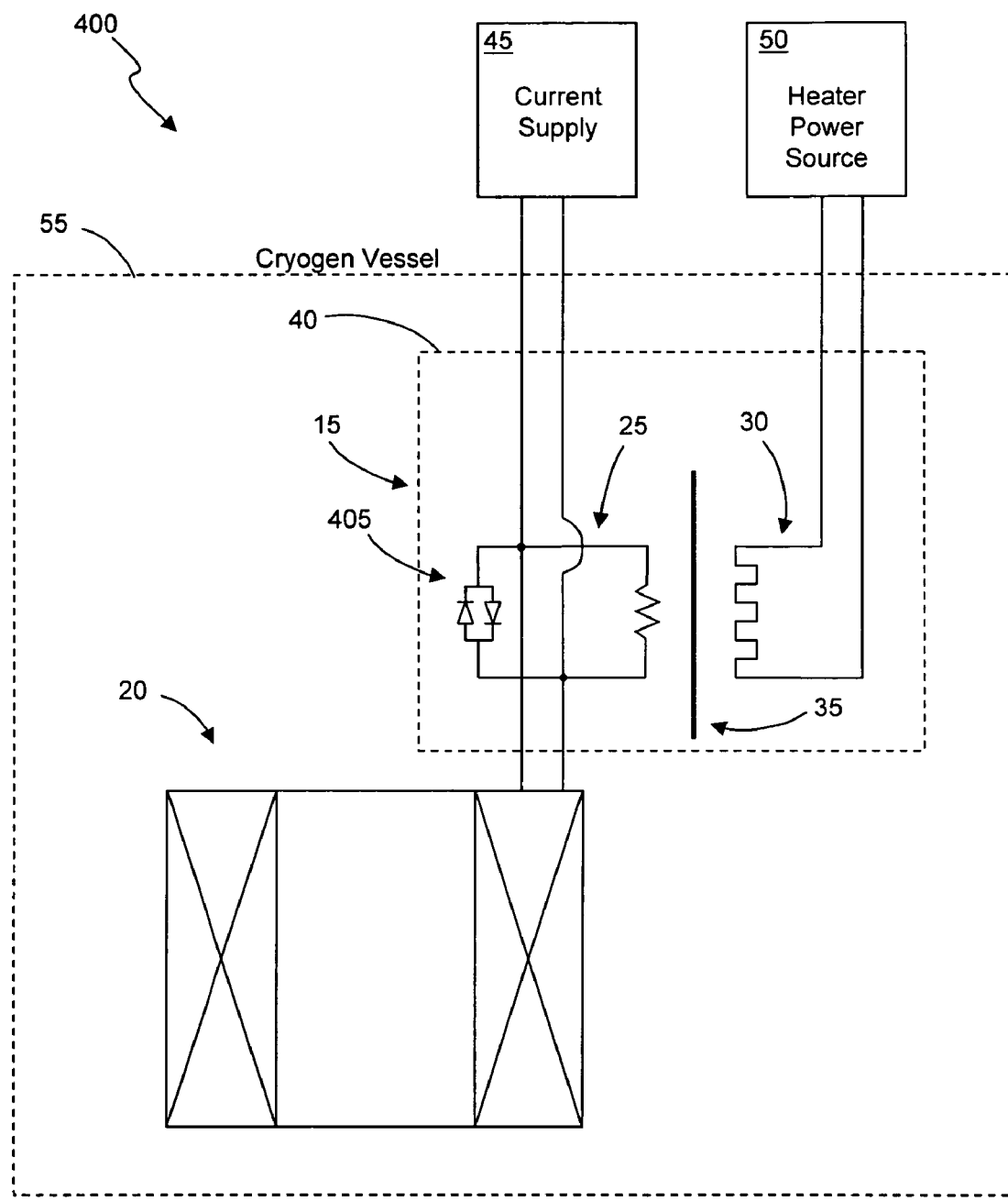
FIG. 4 is an electrical schematic diagram of an alternative embodiment of a magnet system implementing a protective element.

To prevent or minimize damage to the switch as a result of a critical event, such as those described above, the magnet system may be implemented with a suitable protective element, device, or circuit. For example, FIG. 4 is an electrical schematic diagram of an alternative embodiment of a magnet system implementing a protective element. In this figure, magnet system 400 includes many of the same components as system 10 of FIG. 1. However, magnet system 400 includes protective element 405, which is electrically connected in parallel to magnet 20 and switch 25.

One purpose of the protective element is to limit the power being dissipated through the switch in case of a failure or critical event, such as those described above. In particular, the protective element may limit the maximum voltage across the switch. The protective element may be implemented using, for example, a pair of diodes such as those depicted in FIG. 4. Operation of magnet system 400 occurs in a manner similar to that of the system of FIG. 1, but would of course have the added protection provided by protection element 405. Note that any of the various switch and magnet systems presented herein may also be configured with one or more protective elements.

While the invention has been described in detail with reference to disclosed embodiments, various modifications within the scope of the invention will be apparent to those of ordinary skill in this technological field. It is to be appreciated that features described with respect to one embodiment typically may be applied to other embodiments. Therefore, the invention properly is to be construed only with reference to the claims.

What is claimed is:

1. A magnet system for generating a magnetic field, said system comprising:
   a superconducting magnet structured to generate magnetic fields;
   a switch comprising a non-inductive superconducting current carrying path connected in parallel to said superconducting magnet, said switch structured to only carry a level of current that is a portion of current required to obtain a full field by said superconducting magnet; and
   a heater element thermally coupled to said switch.

2. The magnet system according to claim 1, further comprising:
   a current supply structured to provide effectively continuous current to said superconducting magnet during generation of said magnetic fields.

3. The magnet system according to claim 1, further comprising:
   a heater power source in electrical communication with said heater element, said switch capable of changing from a superconducting mode to a non-superconducting mode responsive to heat generated by said heater element.

4. The magnet system according to claim 1, further comprising:
   a non-conductive housing which contains said switch and said heater element.

5. The magnet system according to claim 4, wherein said housing is adapted to be inserted into a vessel containing a cryogen, said housing including thermal material structured to inhibit heat transfer from said switch and said heater element to said cryogen.

6. The magnet system according to claim 1, further comprising:
   cooler means;
   a first thermal link thermally coupled between said cooler means and said switch, said first thermal link structured to effectively cool said switch to a superconducting temperature; and
   a second thermal link thermally coupled between said cooler means and said superconducting magnet, said second thermal link structured to effectively cool said superconducting magnet to a superconducting temperature.

7. The magnet system according to claim 6, further comprising:
   a cooler controller structured to control said cooler means and causing said first thermal link and said second thermal link to respectively cool said switch and said superconducting magnet to a desired superconducting temperature.

8. The magnet system according to claim 1, further comprising:
   a radio frequency (RF) shield positioned relative to said switch and said heater element to effectively reduce coupling of RF signals between said switch and said heater element.

9. The magnet system according to claim 1, wherein said current carrying path is a thin-film current carrying path.

10. The magnet system according to claim 1, wherein said switch comprises non-clad, bifilar wound, superconducting wire.

11. The magnet system according to claim 10, wherein said superconducting wire includes a diameter of about 5μm - 125μm.

12. The magnet system according to claim 1, wherein said switch is structured to only carry a level of current that is about 1%-20% of said current required to obtain said full field of said superconducting magnet.

13. The magnet system according to claim 1, wherein said switch is structured to only carry a level of current that is about 2%-7% of said current required to obtain said full field of said superconducting magnet.

14. The magnet system according to claim 1, wherein said superconducting magnet comprises a solenoid.

15. The magnet system according to claim 1, further comprising:
   a protective element connected in parallel to said switch and structured to limit maximum voltage across said switch.

16. The magnet system according to claim 15, wherein said protective element comprises an electrical circuit.

17. The magnet system according to claim 15, wherein said protective element comprises at least two diodes.

18. A switch for use with a superconducting magnet, said switch comprising:
   a non-inductive superconductive current carrying path for connecting in parallel to said superconducting magnet, said switch structured to only carry a level of current that is a portion of current required to obtain a full field by said superconducting magnet, wherein said switch is a non-persistent switch; and
   a heater element thermally coupled to said switch.

19. The switch according to claim 18, further comprising:
   a current supply structured to provide effectively continuous current to said superconducting magnet during generation of magnetic fields by said superconducting magnet.

20. The switch according to claim 18, wherein said switch is further structured to change from a superconducting mode to a non-superconducting mode responsive to heat generated by said heater element.

21. The switch according to claim 18, further comprising:
   a non-conductive housing which contains said non-inductive superconductive current carrying path and said heater element.

22. The switch according to claim 21, wherein said housing is adapted to be inserted into a vessel containing a cryogen, said housing including thermal material structured to inhibit heat transfer from said switch and said heater element to said cryogen.

23. The switch according to claim 18, further comprising:
   cooler means; and
   a first thermal link thermally coupled between said cooler and said non-inductive superconductive current carrying path, said first thermal link structured to effectively cool said non-inductive superconductive current carrying path to a superconducting temperature.

24. The switch according to claim 23, further comprising:
   a cooler controller structured to control said cooler means and causing said first thermal link to cool said non-inductive superconductive current carrying path to a desired superconducting temperature.

25. The switch according to claim 18, further comprising:
   a radio frequency (RF) shield positioned relative to said non-inductive superconductive current carrying path and said heater element to effectively reduce coupling of RF signals between said non-inductive superconductive current carrying path and said heater element.

26. The switch according to claim 18, wherein said non-inductive superconductive current carrying path includes a thin-film current carrying path.

27. The switch according to claim 18, wherein said non-inductive superconductive current carrying path comprises non-clad, bifilar wound, superconducting wire.

28. The switch according to claim 18, wherein said non-inductive superconductive current carrying path is structured to only carry a level of current that is about 1%-20% of said current required to obtain said full field of said superconducting magnet.

29. The switch according to claim 18, wherein said non-inductive superconductive current carrying path is structured to only carry a level of current that is about 2%-7% of said current required to obtain said full field of said superconducting magnet.

30. The switch according to claim 18, further comprising:
   a protective element connected in parallel to said non-inductive superconductive current carrying path and structured to limit maximum voltage across said non-inductive superconductive current carrying path.

31. The magnet system according to claim 30, wherein said protective element comprises an electrical circuit.

32. The magnet system according to claim 30, wherein said protective element comprises at least two diodes.

33. A magnet system for generating a magnetic field, said system comprising:
   a superconducting magnet structured to generate magnetic fields;

means for maintaining electrical current supplied to said superconducting magnet during generation of said magnetic fields;

a non-persistent switch connected in parallel to said superconducting magnet, said switch structured to only carry a level of current that is a portion of current required to obtain a full magnetic field by said superconducting magnet;

means for selectively causing said non-persistent switch to transition between a superconducting mode and a non-superconducting mode; and means for changing said electrical current to generate a desired magnetic field.

34. A method for generating magnetic fields, said method comprising:

maintaining, during the generation of magnetic fields, electrical current supplied to a superconducting magnet structured to generate the magnetic fields; and changing said magnetic fields by:

(a) heating a non-persistent switch connected in parallel to said superconducting magnet to a critical temperature, said heating causing said non-persistent switch to transition to a non-superconducting mode, said switch structured to only carry a level of current that is a portion of current required to obtain a full magnetic field by said superconducting magnet;

(b) changing said electrical current to generate a desired magnetic field; and (c) allowing said switch to cool below said critical temperature, causing said switch to transition to a superconducting mode.

35. The method according to claim 34, further comprising:
repeating operations (a) through (c) with different values for said electrical current to generate a corresponding different magnetic field.

36. The method according to claim 34, further comprising:
cooling said superconducting magnet and said switch with a cryogen.

37. The method according to claim 34, further comprising:
cooling said superconducting magnet and said switch.

38. A magnet system for generating a magnetic field, said system comprising:

a superconducting magnet structured to generate magnetic fields;

means for supplying current to said magnet;

a non-persistent switch comprising a non-inductive superconducting current carrying path connected in parallel between said current supply means and said superconducting magnet, said switch structured to only carry a level of current that is a portion of current required to obtain a full field by said superconducting magnet; and a heater element thermally coupled to said switch.

39. The magnet system according to claim 1, wherein said switch is a non-persistent switch.

* * * * *